US012696732B2

(12) United States Patent
Yoshinaga

(10) Patent No.: US 12,696,732 B2
(45) Date of Patent: Jul. 28, 2026

(54) SEMICONDUCTOR DEVICE, METHOD OF TESTING THE SAME, AND METHOD OF DESIGNING THE SAME

(71) Applicant: RENESAS ELECTRONICS CORPORATION, Tokyo (JP)

(72) Inventor: Hiroko Yoshinaga, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 861 days.

(21) Appl. No.: 17/875,109

(22) Filed: Jul. 27, 2022

(65) Prior Publication Data

US 2023/0095204 A1 Mar. 30, 2023

(30) Foreign Application Priority Data

Sep. 30, 2021 (JP) ................................. 2021-160890

(51) Int. Cl.
*H10P 74/00* (2026.01)
*G01R 31/26* (2020.01)
*G06F 30/392* (2020.01)

(52) U.S. Cl.
CPC ........ *H10P 74/273* (2026.01); *G01R 31/2644* (2013.01); *G06F 30/392* (2020.01)

(58) Field of Classification Search
CPC . H01L 22/32; G01R 31/2644; G01R 31/2884; G06F 30/392; G11C 5/025; G11C 5/063; G11C 29/1201
See application file for complete search history.

(56) References Cited

U.S. PATENT DOCUMENTS

| | | | |
|---|---|---|---|
| 5,515,334 A | 5/1996 | Kotani et al. | |
| 7,663,163 B2 | 2/2010 | Ojiro | |
| 7,999,381 B2 * | 8/2011 | Lin ..................... | G01R 31/2884 |
| | | | 257/738 |
| 9,824,946 B2 | 11/2017 | Byun et al. | |
| 2006/0190779 A1 * | 8/2006 | Nakatsu ............. | G11C 29/1201 |
| | | | 714/718 |

(Continued)

FOREIGN PATENT DOCUMENTS

| | | |
|---|---|---|
| JP | H10-261718 A | 9/1998 |
| JP | 2000-3600 A | 1/2000 |
| JP | 2000003600 A * | 1/2000 |

(Continued)

OTHER PUBLICATIONS

Office Action dated Dec. 24, 2024, from corresponding Japanese Application No. 2021-160890, 10 pages.

(Continued)

*Primary Examiner* — Fernando L Toledo
*Assistant Examiner* — Marshall Mu-Nuo Hatfield
(74) *Attorney, Agent, or Firm* — Rimon P.C.

(57) ABSTRACT

Signal delay, etc. in a signal path from an electrode pad to a functional block is reduced. An input-output block A and an input-output block B are connected to electrode pads. A functional block A is connected to the electrode pads via the input-output block A. A functional block B is connected to the electrode pads via the input-output block B. The functional block A and the functional block B are arranged at positions opposed to each other so as to sandwich the input-output block A and the input-output block B.

10 Claims, 13 Drawing Sheets

(56) References Cited

U.S. PATENT DOCUMENTS

| 2009/0193374 | A1 |   | 7/2009 | Fujimoto et al. |
|---|---|---|---|---|
| 2017/0003341 | A1 | * | 1/2017 | Whetsel ............... G01R 1/0491 |

FOREIGN PATENT DOCUMENTS

| JP | 2001-034650 | A | 2/2001 |
|---|---|---|---|
| JP | 2003-224198 | A | 8/2003 |
| JP | 2008-21834 | A | 1/2008 |
| JP | 2009-170459 | A | 7/2009 |
| KR | 10-2017-0070434 | A | 6/2017 |

OTHER PUBLICATIONS

Office Action issued on Oct. 31, 2025 in the corresponding Korean patent application No. 10-2022-0116146, w/ English Translation.

* cited by examiner

Figure 3:
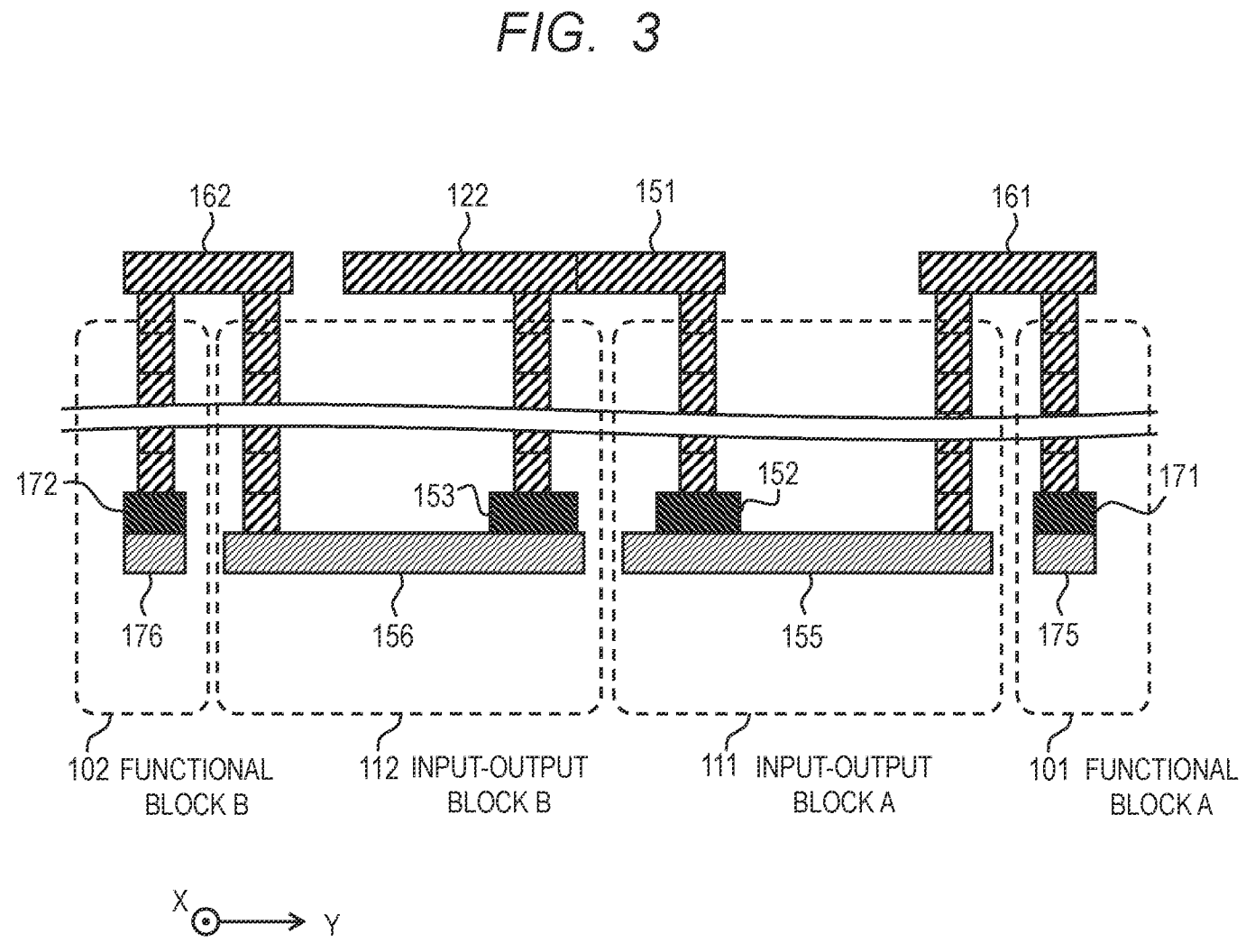

101 FUNCTIONAL BLOCK A

111 INPUT-OUTPUT BLOCK A

155

152

151

122

153

156

112 INPUT-OUTPUT BLOCK B

162

176

172

102 FUNCTIONAL BLOCK B

SEMICONDUCTOR DEVICE, METHOD OF TESTING THE SAME, AND METHOD OF DESIGNING THE SAME

CROSS-REFERENCE TO RELATED APPLICATIONS

The disclosure of Japanese Patent Application No. 2021-160890 filed on Sep. 30, 2021, including the specification, drawings and abstract is incorporated herein by reference in its entirety.

BACKGROUND

The present disclosure relates to a semiconductor device, and a method of testing and designing the semiconductor device, and relates to, for example, a semiconductor device having a plurality of functional blocks, a method of testing and designing such a semiconductor device.

There is a disclosed technique listed below.
[Patent Document 1] Japanese Unexamined Patent Application Publication No. 2001-34650

As a related art, Patent Document 1 discloses a method of designing a semiconductor device. In Patent Document 1, the semiconductor device combines a plurality of macro cells by placing various element circuits on the semiconductor chip is designed. The semiconductor device has a plurality of pads arranged at predetermined intervals along its outer periphery. Further, the semiconductor device has an Analog to Digital (AD) converter arranged in the chip center portion, and an input-output buffer cell arranged at the chip outer periphery. The AD converter and the input-output buffer cell are connected to each other and the input-output buffer cell and the pad are connected to each other.

SUMMARY

Recently, with the increase in performance and functionality of electronic devices, a plurality of functional is blocks is often mounted on a semiconductor chip. In such a semiconductor chip, in order to reduce the number of pads mounted on the semiconductor chip, a pad for inputting and outputting the signal of each functional block to the outside may be shared among a plurality of functional blocks. In Patent Document 1, is not considered that a pad is shared among a plurality of functional blocks. In Patent Document 1, if a pad shared among a plurality of functional blocks, the length of the wiring from the pad to one functional block is longer than the length of the wiring from the pad to the other functional block.

Other objects and novel features will be apparent from the description of this specification and the accompanying drawings.

According to one embodiment, a semiconductor device is provided. The semiconductor device includes first and second input-output blocks, a first functional block, and a second functional block. The first functional block is connected to each of a plurality of electrode pads via the first input-output block. The second functional block is connected to each of the plurality of electrode pads via the second input-output block. In the semiconductor device, the first functional block and the second functional block are arranged at positions opposed to each other so as to sandwich the first and second input-output blocks.

According to one embodiment, in the signal path from the electrode pad to the first functional block via the first input-output block and the signal path from the electrode pad to the second functional block via the second input-output block, it is possible to reduce the resistance and capacitance attached to each signal path.

BRIEF DESCRIPTION OF THE DRAWINGS

FIG. 3 is cross-sectional diagram showing an A-A cross section of FIG. 1.

FIG. 13 is a block diagram showing a part of a semiconductor chip.

DETAILED DESCRIPTION

Figure 12:
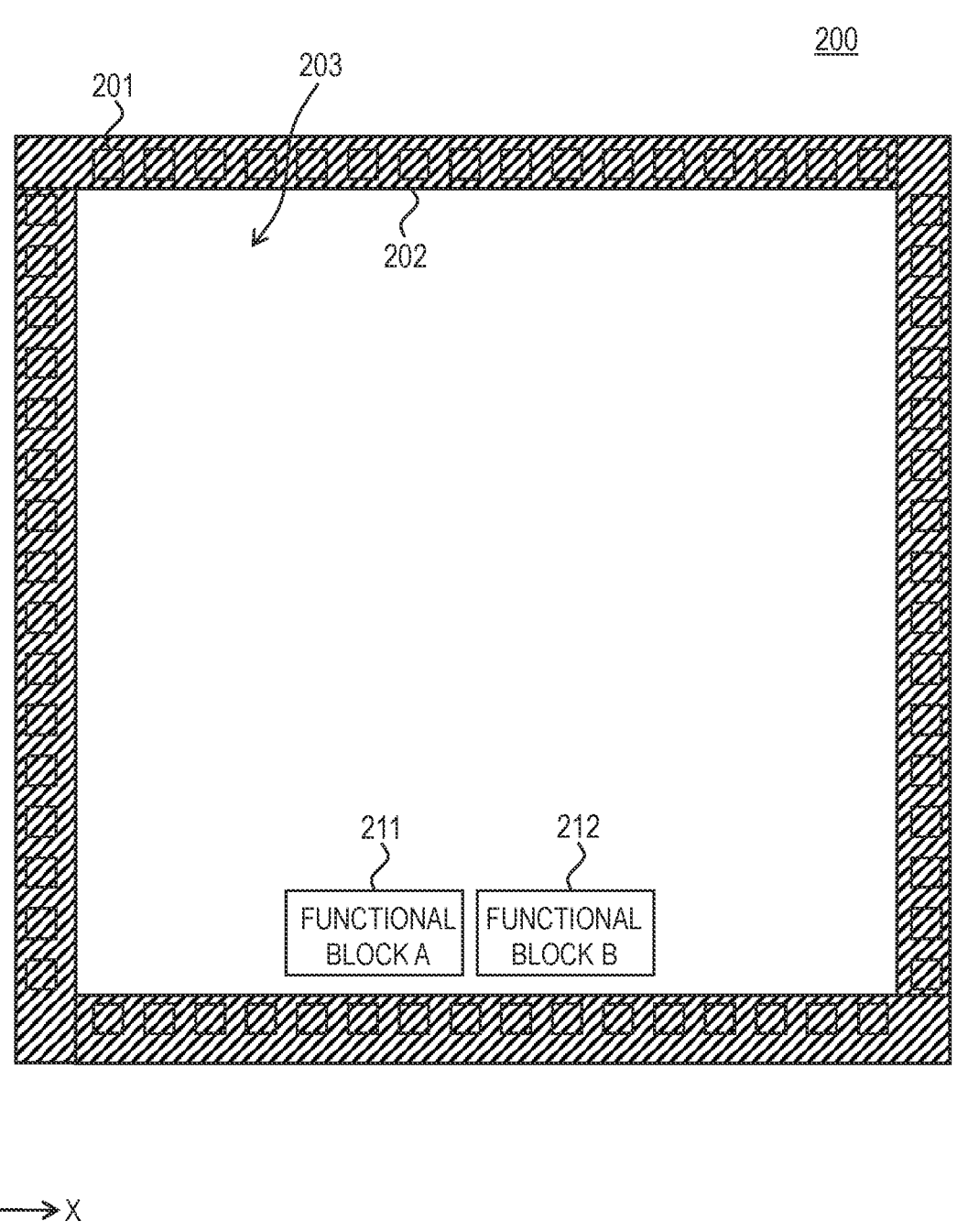
FIG. 12 is a plan view showing an example of a layout of a semiconductor device used in the study.

Prior the description of the embodiments, the background leading to the following embodiments will be described. FIG. 12 shows an example of a layout of a semiconductor device (semiconductor chip) used in the study. This semiconductor chip 200 includes a plurality of electrode pads 201 an input-output block (input-output circuit) 202, and an internal logic forming region 203. The plurality of electrode pads 201, at the peripheral portion of the semiconductor chip 200, is arranged side by side in the X direction and Y direction. In the semiconductor chip 200, the plurality of electrode pads 201 is stacked and arranged on the input-output circuit 202 in order to reduce the chip area.

A plurality of functional blocks is arranged in the internal logic forming region 203. The plurality of functional blocks includes, but is not limited to, a Central Processing Unit (CPU), a Random Access Memory (RAM), a Read Only Memory (ROM), and peripheral circuits. In the example of FIG. 12, a functional block (functional block A) 211 and a functional block (functional block B) 212 are arranged in the internal logic forming region 203. At least a portion of the plurality of electrode pads 201 s shared by the plurality of functional blocks.

FIG. B shows a part of the above-mentioned semiconductor chip. In this case, the two electrode pads 251 and 252 are shared by the functional block A 211 and the functional block B 212. The electrode pads 251 and 252 correspond to the electrode pads 201 shown in FIG. 12. electrode pads 251 and 252, respectively, are connected to the input-output circuit. (input-output circuit A) 221 of the functional block A 211 and the input-output circuit (input-output circuit B) 222 of the functional block B 212. The input-output circuit A 221 and the input-output circuit B 222 include a block connected to the electrode pad 251 and a block connected to the electrode pad 252, respectively. The input-output circuit A 221 and the input-output circuit B 222, at the peripheral portion of the semiconductor chip 200, are arranged side by side in the X direction.

Figure 13:
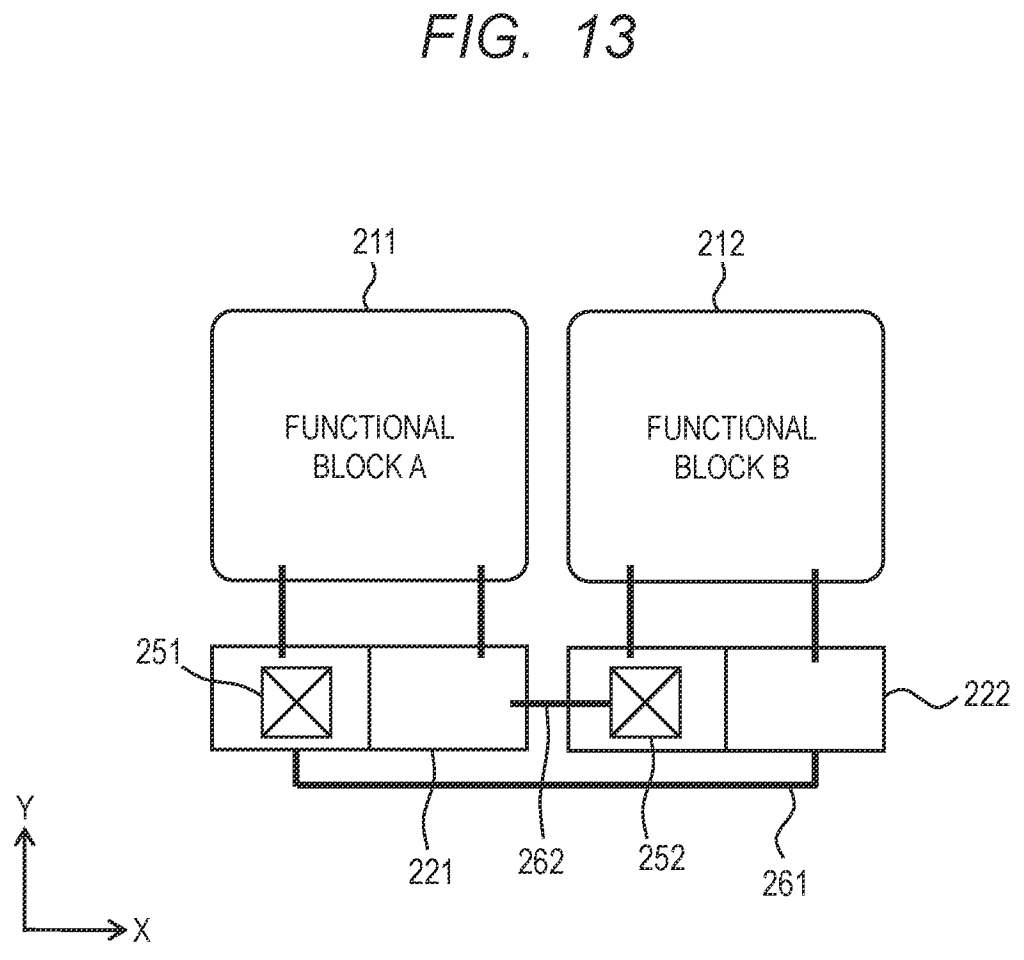

In FIG. 13, the electrode pads 251 is stacked on the input-output circuit A 221 and the electrode pad 252 is stacked on the input-output circuit B 222. The electrode pad 251 is connected to the input-output circuit A 221 via a contact and is connected to the input-output circuit B 222 via a wiring 261. On the other hand, the electrode pad 252 is connected to the input-output circuit B 222 via a contact and is connected to the input-output circuit A 221 via a wiring 262. The functional block A 211 is connected to the input-output circuit 221. The functional block B 212 is connected to the input-output circuit 222.

Here, in the semiconductor chip, a voltage drop, a change in signal change timing, and noise may occur in the wiring for connecting the electrode pad and the input-output circuit and the wiring for connecting the functional block and the input-output circuit. In the design of the semiconductor chip 200, for reduction of noise or the like, the design is carried out so that the wiring does not have resistance and capacitance, In the example of FIG. 13, the electrode pad 251 is stacked on the input-output circuit A 221, and the electrode pad 251 and the input-output circuit A 221 are connected on the input-output circuit A 221, Further, the electrode pad 252 is stacked on the input-output circuit B 222, and the electrode pad 252 and the input-output circuit. B 222 are connected on the input-output circuit B 222.

However, the electrode pad 251 and the input-output circuit B 222, in order to avoid shorting the electrode pad 252 are connected using the wiring 261 passing through the outer area of the input-output circuit A 221 and the input-output circuit B 222. The electrode pad 252 and the input-output circuit A 221 are also connected using the wiring 262 passing through the outer area of the input-output circuit A 221 and the input-output circuit B 222. In the example of FIG. 13, the block connected to the electrode pad 251 and the block connected to the electrode pad 252 of the input-output circuit A 221 are arranged in the X direction. Therefore, in particular, it is impossible to shorten the wiring length of the wiring 261, and in the wiring 261, a voltage drop occurs and also noise occurs. If, when the input-output circuit A 221 and the input-output circuit B 222 are arranged side by side tin the Y direction, the wiring lengths of the wirings 261 and 262 are shorter than the wiring length in the case of the example of FIG. 13. However, in that case, the wiring length of the wiring between the input-output circuit B 222 and the functional block B 212 becomes longer. The present inventor has focused on the above-described problems and has come to conceive the following embodiments.

Embodiments to which means for solving the above problems is applied will be described in detail below with reference to the drawings. For clarity of explanation, the following description and drawings are appropriately omitted and simplified. In each drawing, the same elements are denoted by the same reference numerals, and a repetitive description thereof is omitted as necessary.

In the following embodiments, when necessary for convenience, the description will be made by dividing into a plurality of sections or embodiments, but except when specifically stated, they are not independent of each other, and one is related to the modified example, detail, supplementary description, or the like of part or all of the other.

Further, in the following embodiments, when the number of elements etc. (including the number, numerical value, quantity, range, etc.) is referred to, except the case where it is specified in particular or the case where it is obviously limited to the specific number in principle, the number is not limited to the specific number, and may be more than or less than the specific number.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed t a the shapes and the like are substantially approximate to or similar to the shapes and the like, except for the case in which they are specifically specified and the case in which they are considered to be obvious in principle, and the like. The same applies to the above-mentioned numbers and the like (including the number, numerical value, quantity, and range).

First Embodiment

Figure 1:
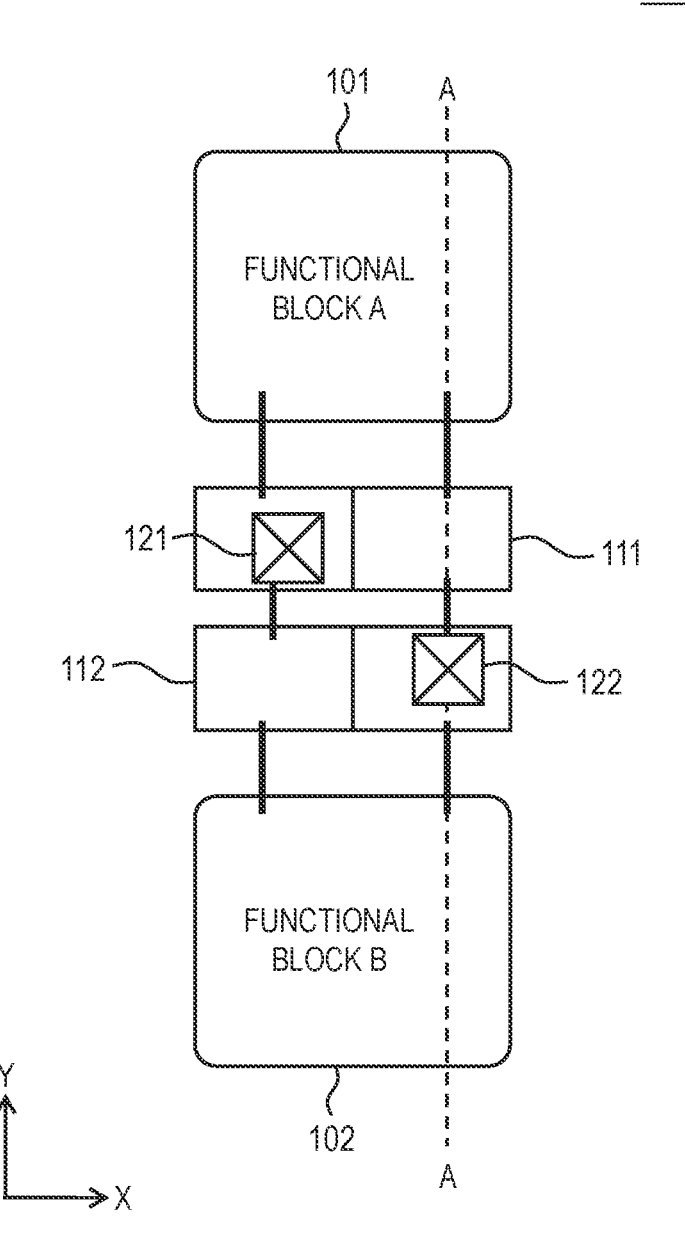
FIG. 1 is a block diagram showing a part of a semiconductor device according to a first embodiment of the present disclosure.

FIG. 1 shows a part of a semiconductor device according to a first embodiment of the present disclosure. A semiconductor device 100 includes a functional block A 101, functional block B 102, input-output. block A 111, input-output block B 112, electrode pad 121, and electrode pad 122. The functional block A 101 and functional block B 102 are circuit blocks for performing a predetermined function, respectively. The functional block A 101 and the functional block B 102 each include circuit elements such as lociic elements, active elements, and storage elements.

The input-output block A 111 includes an input-output circuit for the functional block A 101. The input-output block B 112 includes an input-output circuit for the functional block B 102. The electrode pads 121 and 122 are pads for signal input and output shared by the functional block A 101 and the functional block B 102, respectively . Each of the input-output block A 111 and the input-output block B 112 includes a block connected to the electrode pad 121 and a block connected to the electrode pad 122. The electrode pad 121 is connected to one block of the input-output block. A 111 and one block of the input-output block B 112, Further, the electrode pad 122 is connected to the other block of the input-output block A 111 and the other block of the input-output block B 112. The input-output block A 111 is connected to the functional block A 101. The input-output block B 112 is connected to the functional block B 102. The electrode pads 121 and 122 are connected to the input-output block A 111 and the input-output block B 112 on the input-output block, respectively.

Figure 2:
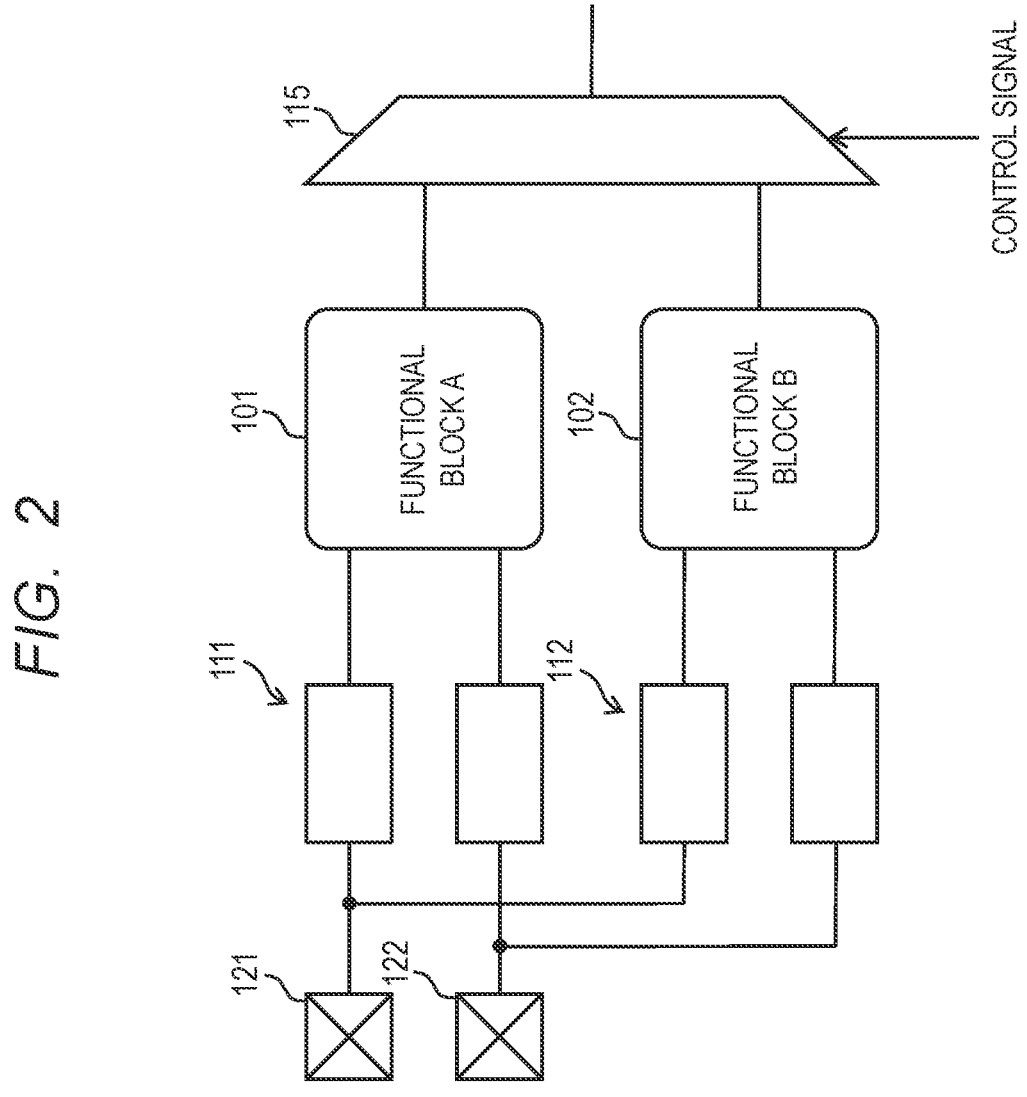
FIG. 2 is a circuit diagram showing a circuit configuration of the semiconductor device.

FIG. 2 shows a circuit configuration of the semiconductor device 100. Signals input from the electrode pads 121 and 122 are branched into the input-output block A 111 and the input-output block B 112, respectively. The signal input from the electrode pad 121 is input to the functional block A 101 via the input-output block A 111, is input to the functional block B 102 via the input-output block B 112. The signal input from the electrode pad 122 is input to the functional block A 101 via the input-output block A 111, is input to the functional block B 102 via the input-output block B 112.

A selector 115 selectively outputs a signal output by the functional block A 101 and a signal output by the functional block B 102 in response to a control signal. The selector 115 selects the signal output by the functional block A 101 when the signals input from the electrode pads 121 and 122 are used by the functional block A 101. The selector 115 selects the signal output by the functional block B 102, when the signals input from the electrode pads 121 and 122 are used by the functional block B 102.

In the above, the example was described in which the signals input from the electrode pads 121 and 122 are input to the functional block A 101 and the functional block B 102 and the selector 115 selects one of the outputs of the functional block A 101 and the output of the functional block B 102. However, the present embodiment is not limited to this. For example, the selection of signals may be performed at the input sides of the functional blocks, and a selector may be disposed between the electrodes pads 121 and 122, and the functional blocks A 101 and B 102. In that case, the selector selectively outputs the signal inputs from the electrode pads 121 and 122 to the functional block A 101 or functional block B 102.

The electrode pads 121 and 122 are formed at positions overlapping with one of the input-output block. A 111 and the input-output block B 112. As shown in FIG. 1, in the present embodiment, the electrode pad 121 is arranged on. the upper layer of the input-output. block A 111. Further, the electrode pad 122 is arranged on the upper layer of the input-output block B 112. In other words, the electrode pad 121 stacked and arranged on the input-output blocs A 111, and the electrode pad 122 is stacked and arranged on the input-output block B 112. The input-output block A 111 and the input-output block B 112 are arranged side by side in the Y direction. Further, the functional block. A 101 and the functional block B 102 are arranged so as to sandwich the input-output block A 111 and the input-output block B 112 from the Y direction. In other words, the functional block A 101 and the functional block B 102 are arranged so as to oppose each other in the Y direction and sandwich the input-output block A 111 and the input-output block B 112.

FIG. 3 shows an A-A cross section of FIG. 1. The electrode pad 122, for example, is formed in an aluminum (AL) layer that is the uppermost layer of the wiring layer. A wiring 151 is formed in the AL layer, draws a signal input from the electrode pad 122 to a region where the input-output block A 111 is formed. The input-output blocking A 111 includes a gate 152 and a diffusion layer 155. The wiring 151 is connected to the gate 152 via a contact formed in the wiring layer. The output of the input-output block A 111 is connected to a wiring 161 formed in the AL layer via a contact formed in the wiring layer. The functional block A 101 includes a gate 171 and a diffusion layer 175. The wiring 161 is connected to the gate 171 via a contact.

The input-output. block B 112 includes a gate 153 and a diffusion la yer 156. The electrode pad 122, in a region where the input-output block B 112 is formed, is connected to the gate 153 via a contact formed in the wiring layer. The output of the input-output block B 112 is connected to a wiring 162 formed in the AL layer via a contact formed in the wiring layer. The functional block. B :1.02 includes a gate 172 and a diffusion layer 176. The wiring 162 is connected to the gate 172 via contact.

Figure 4:
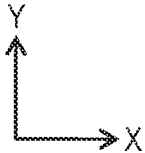
FIG. 4 is a plan view showing a layout example of a semiconductor chip.

Subsequently, a layout example of the semiconductor chip having the structure shown in FIG. 1 will be described. FIG. 4 shows a layout example of a semiconductor chap that includes the part of the semiconductor device shown in FIG. 1. In the example of FIG. 4, a semiconductor chip 150a includes the functional block A 101, the functional block B 102, CPU0-CPU3 (130-133), and RAMs 135 and 136. Further, the semiconductor chip 150a includes a plurality of electrode pads 140 arranged at. the peripheral portion in the X direction and the Y direction, and an input-output block 141. In the semiconductor chip 150a, the electrode pads 140 are arranged on the upper layer of the input-output block 141, similarly to the semiconductor chip 200 shown in FIG. 12. The electrode pads 121 and 122 for the functional block A 101 and the functional block B 102 are disposed inside the chap. In the example of FIG. 4, the functional block A 101, the functional block B 102, the input-output block A 111, and the input-output block B 112 are arranged in. a region on the semiconductor chip 150a that is located at the middle portion in the X direction and the end portion in the Y direction.

Figure 5:
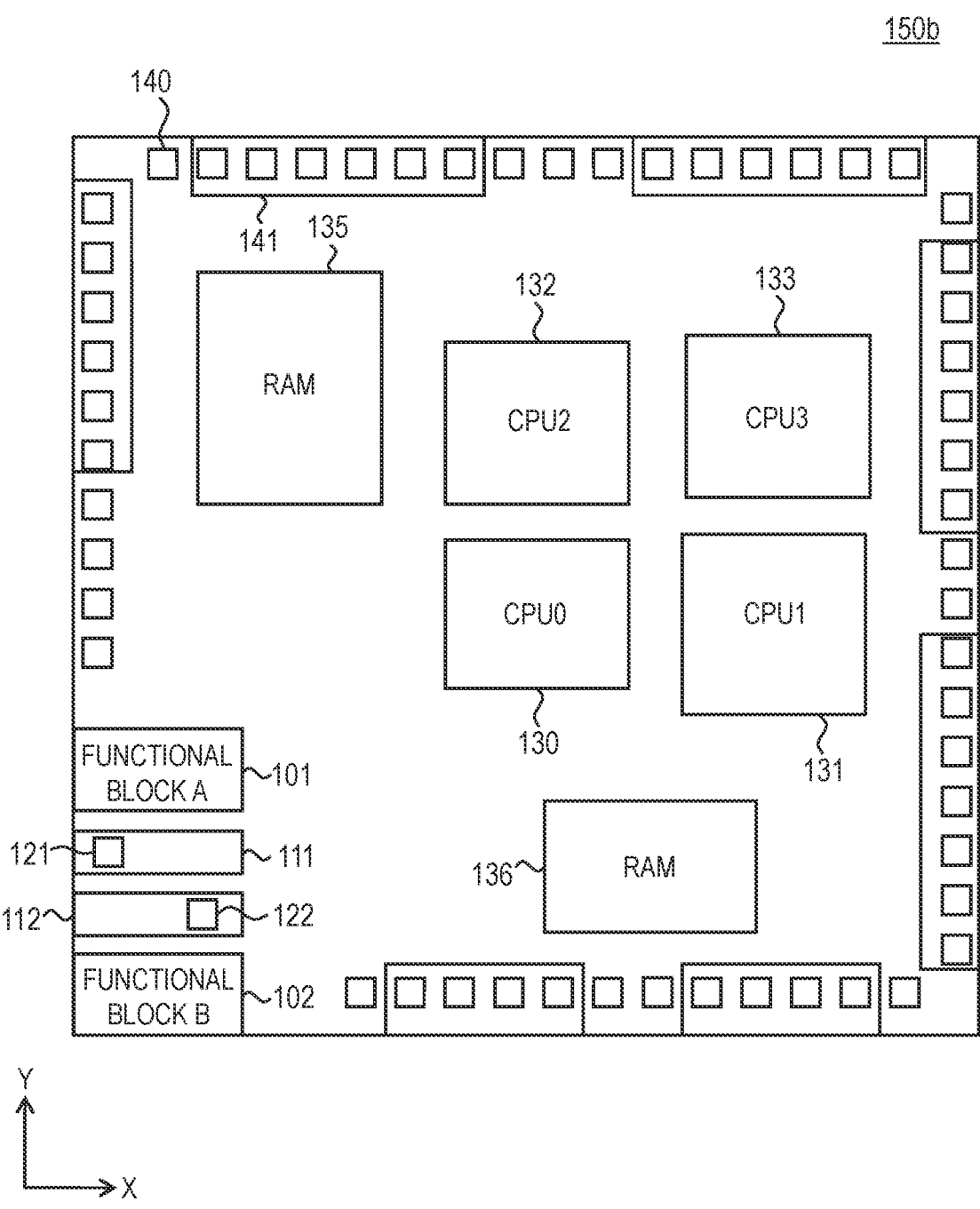
FIG. 5 is a plan view showing another layout example of a semiconductor chip.

FIG. 5 shows another layout example of a semiconductor chip that includes the part of the semiconductor device shown in FIG. 1. In a semiconductor chip 150b shown in FIG. 5, the functional block A 101, the functional block B 102, the input-output block A 111, and. the input-output block B 112 are arranged in the corner portion of the semiconductor chip. The arrangement of the CPUO-CPU3 (130-133) and the RANe 135 and 136 in the semiconductor chip 150b may be similar to their arrangement in the semiconductor chip 150a.

Comparing the semiconductor chip 150a shown in FIG. 4 with the semiconductor chip 150b shown in FIG. 5, the semiconductor chip 150a is able to increase the number of the electrodes 140 and the input-output blocks 141 that are arranged at the peripheral portion of the chip as compared with the semiconductor chip 150b. Therefore, when a large number of the electrode pads 140 are to be arranged, as in the semiconductor chip 150a, the functional block A 101, the functional block B 102, the input-output block A 111, and the input-output block B 112 may be arranged at the end portion of the central portion of the chip.

However, in the semiconductor chip 150a, the functional block. A 101, the input-output block. A 111, and the input-output. block B 112 are arranged between the CPU1 (131) and the RAM 136. Therefore, when a wiring (digital signal wiring) connecting the CPU1 (131) and the RAM 136 is formed, it is difficult to form the wiring linearly. In many cases, digital signal wiring needs to bypass the functional block A 101, the input-output block A 111, and the input-output block B 112. Therefore, in the semiconductor chip 150a, wiring congestion occurs, and the degree of freedom of the floor plan decreases. In contrast, in the semiconductor chip 150b, there is no influence of the detour of the digital signal wiring and a high degree of freedom of the floor plan in the semiconductor chip 150b. Therefore, when prioritizing the degree of freedom of the floor plan, as in the semiconductor chip 150b, the functional block A 101, the functional block B 102, the input-output block A 111, and the input-output block B 112 may be arranged in the corner portion of the chip.

As shown in FIGS. 4 and 5, in the semiconductor chips 150a and 150b, the electrode pads 121 and 122 are formed inside the chip. When the semiconductor chip 150a or 150b is connected to a package substrate by wires, the lengths of the wires connected to the electrode pads 121 and 122 are longer than the length of the wire connected to the electrode pad arranged at the peripheral portion. In this case, for example, the risk of wire flow during molding increases, and a short circuit between wires may occur.

Figure 6:
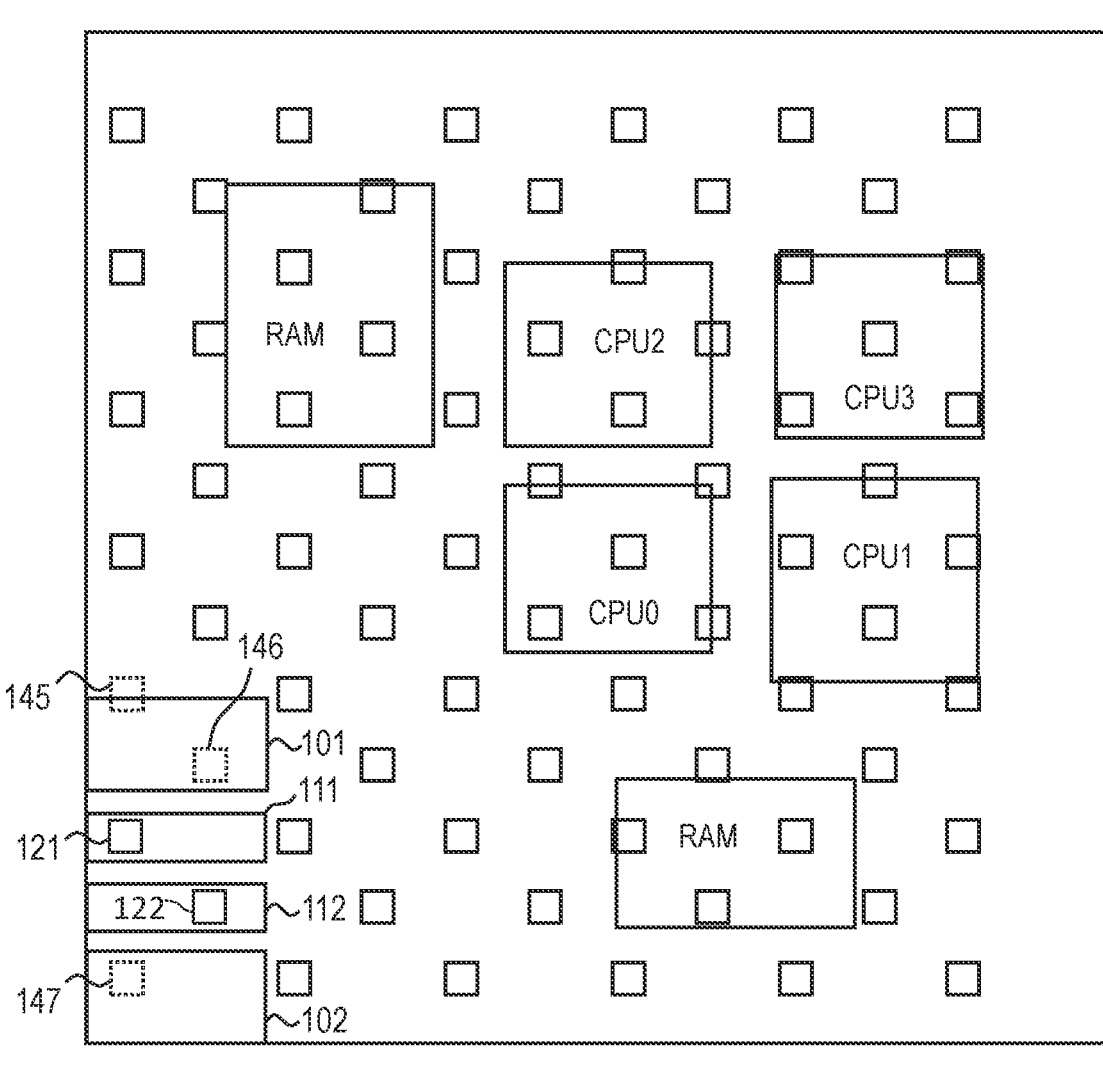
FIG. 6 is a plan view showing yet another layout example of a semiconductor chip.
Figure 6:
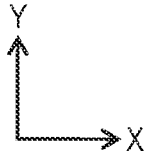

FIG. 6 shows yet another layout example of a semiconductor chip that includes the semiconductor device 100. A semiconductor chip 150c shown in FIG. 6 is a semiconductor chip that is flip-chip connected to a package substrate. The semiconductor chip 150c includes a plurality of electrode pads 140 uniformly arranged on the entire surface of the chip. If a semiconductor chip is flip-chip packaging, there is no risk of wire flow even if the electrode pads 121 and 122 are arranged inside the chip. Therefore, the structure of the present embodiment is compatible with the flip-chip packaging.

Incidentally, in the case of the flip-chip packaging, if the pads are not arranged evenly, the resin filling the semiconductor chip and the frame of the package cannot be injected evenly, and the chip and the package cannot be brought into close contact. Therefore, as shown in FIG. 6, the electrode pad may be arranged at a position where the electrode pad overlaps with the functional block A 101 or the functional block B 102. Electrode pads 145-147 arranged at the positions overlapping with the functional block A 101 or the functional block B 102 may be a dummy electrode pads that are not connected anywhere.

Figure 7:
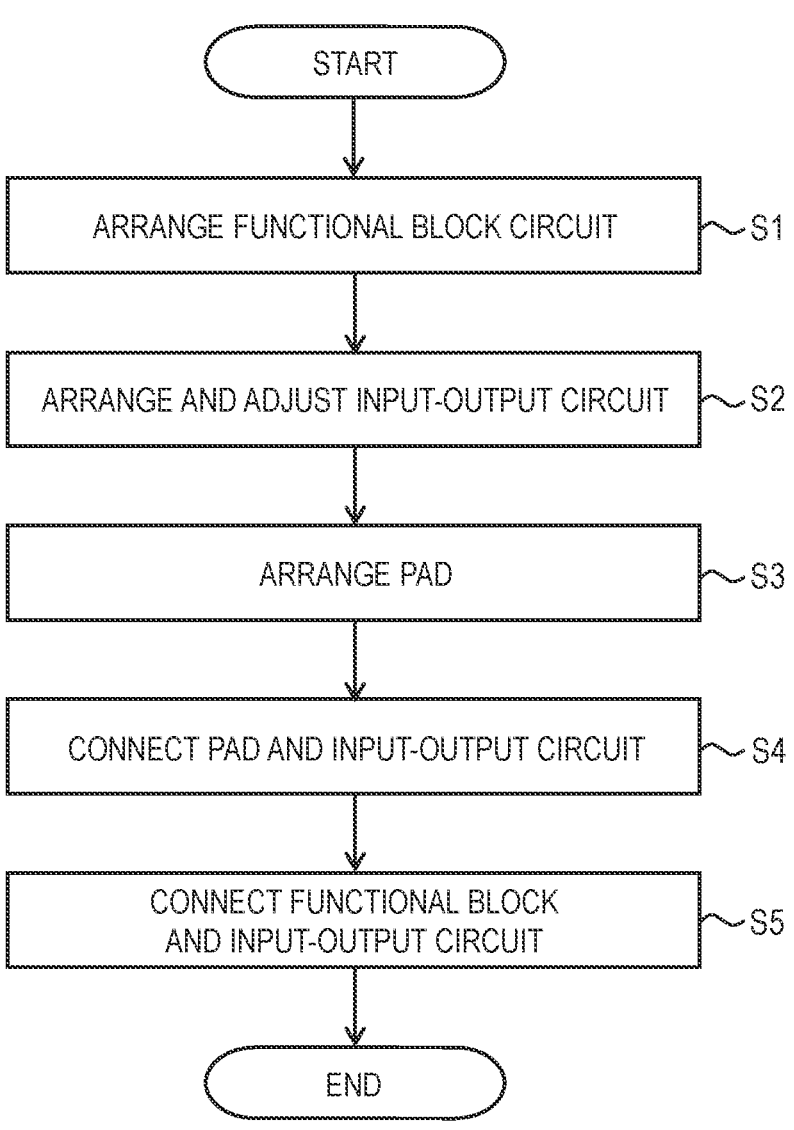
FIG. 7 is a flowchart showing a method of designing a semiconductor device.

FIG. 7 shows a method for designing the semiconductor device 100. In a functional block arrangement process, to match the floor plan of the semiconductor chip, the functional blocks are arranged (Step S1). Then, each input-output block is arranged so as to be sandwich between the plurality of functional blocks that are shares the same electrode pads and the positions of the input-output blocks are adjusted so that the input-output blocks are aligned in one direction, for example, the Y direction (Step S2). Subsequently, the electrode pads shared by the plurality of functional blocks are arranged on one of the input-output blocks (Step S3). The electrode pads and the input-output blocks are connected at the shortest distance (Step S4), and the functional blocks and the input-output blocks are connected at the shortest distance (Step 5).

Figure 8:
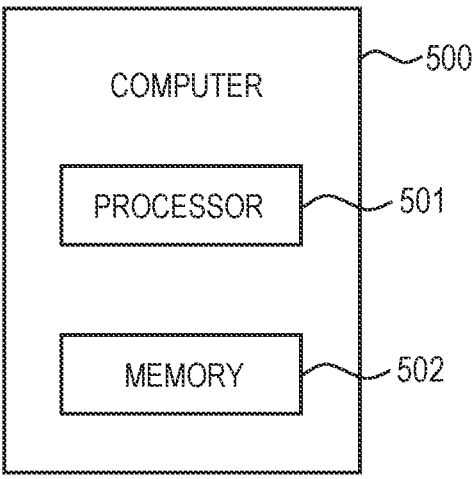
FIG. 8 is block diagram showing a configuration example of a computer.

It should be noted that the method of designing shown in FIG. 7 may be performed by a computer. FIG. 8 shows configuration example of a computer. A computer 500 includes one or more processors 501 and one or more memories 502. The memory 502 stores a program. The program includes instructions (or software code) that cause the computer 500 to perform each step of the method of designing shown in FIG. 7. In the computer 500, the processor 501 performs each step of the method of designing shown in FIG. 7 by reading the program from the memory 502 and executing the processing i.n accordance with the read program.

The above program may be stored in a non-transitory computer-readable medium or a tangible storage medium. By way of example, but not limited to, a computer-readable medium or a tangible storage medium includes RAM, ROM, flash memory, solid-state drive (SSD), other memory technologies, compact disc (CD)-ROM, digital versatile disc (DVD), Blu-ray(registered trademark) disk, other optical disk storages, magnetic cassette, magnetic tape, magnetic disk storage, and other magnetic storage devices. The program may be transmitted on a non-transitory computer-readable medium or a communication medium. By way of example, and not limitation, a non-transitory computer-readable medium or a communication medium may include electrical, optical, acoustic, or other forms of propagated signals.

Effect

In the present embodiment, the functional block A 101 and the functional block B 102 are arranged to oppose each other and to sandwich the input-output block A 111 and the input-output block B 112. In the present embodiment, the electrode pads 121 and 122 shared by the two functional blocks can be connected to the input-output block A 111 and the input-output block B 112 by short-distance wirings.

Further, the input-output block A 111 and the input-output block B 112 can be connected to the functional block. A 101 and the functional block. B 102 by short-distance wirings. Therefore, it is possible to optimize the resistance and capacitance of the wirings from the electrode pads 121 and 122 to the functional block A 101 and functional block B 102, and it is possible to reduce such voltage drop and noise in the signal path. Further, in the present embodiment, the electrode pads 121 and 122 are stacked on one of the input-output blocks. Therefore, in the present embodiment, possible to suppress an increase in the wiring region of the semiconductor chip.

Second Embodiment

Figure 9:
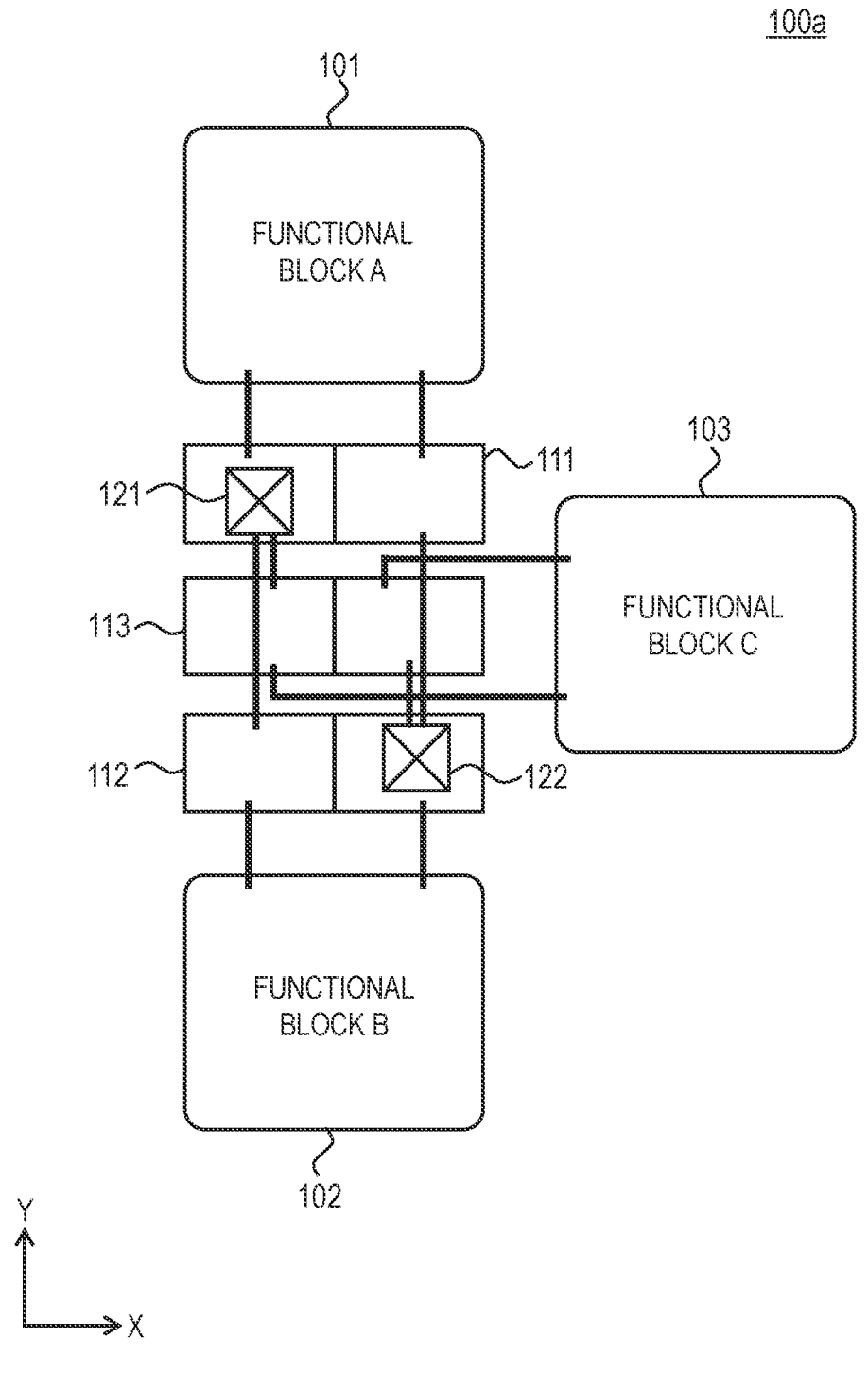
FIG. 9 , a block. diagram showing a semiconductor device according to a second embodiment of the present disclosure.

FIG. 9 shows a semiconductor device according to a second embodiment of the present disclosure. A semiconductor device 100a according to the present embodiment. includes a functional block C 103 and an input-output block C 113 in addition to the configuration of the semiconductor device 100 described in the first embodiment shown in FIG. 1. The input-output block C 113 includes an input-output circuit for the functional block C 103. In the present embodiment, the electrode pads 121 and 122 are shared by the functional block A 101, the functional block B 102, and the functional block C 103, Other configurations may be the same as the configuration of the semiconductor device 100 described in the first embodiment.

The input-output block A 111, the input-output block B 112, and the input-output block. C 113 are arranged in a row along the Y direction. The input-output block C 113 is arranged, for example, between the input-output block A 111 and the input-output block B 112. The electrode pad 121 is formed on any of the three input-output block, for example, the input-output block A 111. The electrode pad 122 is formed on any of the three input-output block, for example, the input-output block B 112. The functional block A 101 and the functional block B 102 are arranged to oppose each other and to sandwich the input-output block in the Y direction. The functional block C103 is arranged side by side in the X direction with respect to the input-output block C 113.

The electrode pad 121 is drawn to a region where the input-output block B 112 and the input-output block C 113 are formed, for example, using a wiring of the uppermost layer of the wiring layer. The electrode pad 122 is drawn to a region where the input-output block A 111 and the input-output block C 113 are formed, for example, using a wiring of the uppermost layer of the wiring layer. The electrode pads 121 and 122 are connected to a gate in each input-output block via a contact provided in the wiring layer.

In the present embodiment, a wiring to the functional block C 103 is slightly longer than the wirings to the functional block A 101 and the functional block B 102. However, the length of the wiring to each functional block can be shortened as compared with the case where three functional blocks and three input-output blocks are arranged side by side in the X direction. Thus, the present embodiment, even when the number of functional blocks is increased than similarly to the first embodiment, it is possible to optimize the resistance and capacity of the wiring, and it possible to reduce such voltage drop and noise in the signal path.

The number of functional blocks connected to the electrode pads 121 and 122 is not particularly limited to the number described above. For example, a semiconductor device may include four functional blocks. In this instance, the input-output block for the fourth functional block (functional block D) may be arranged between the input-output block A 111 and the input-output block B 112. The functional block D may be arranged on the opposite side in the X direction, for example, with the input.-output block of the functional block C 103 sandwiched between them.

Third Embodiment

Figure 10:
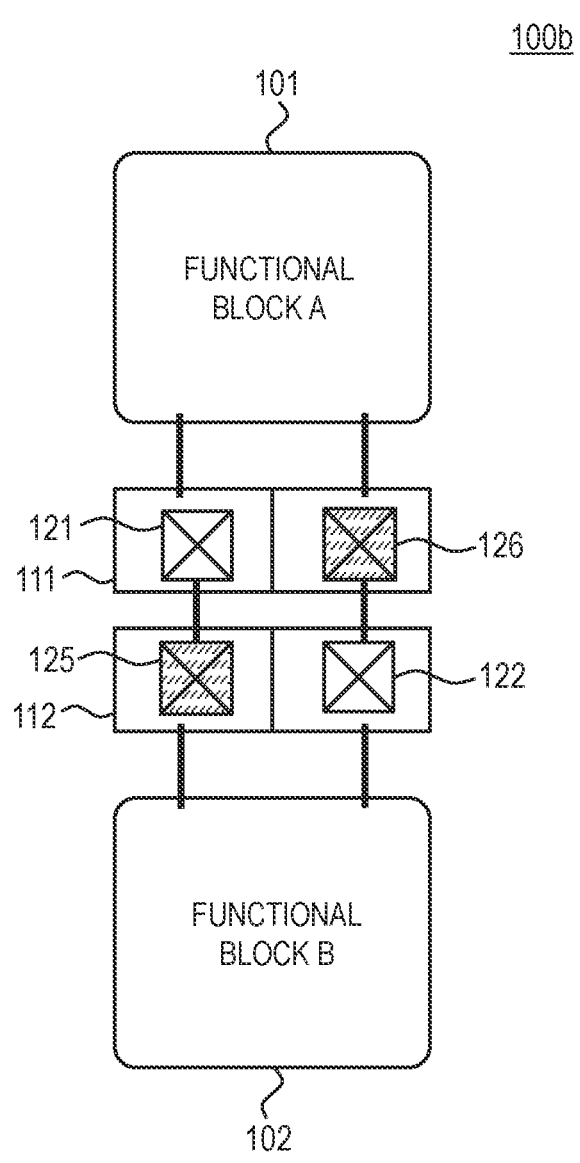
FIG. 10 is a block diagram showing a semiconductor device according to a third embodiment of the present disclosure.
Figure 10:
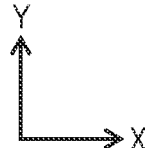

FIG. 10 shows a semiconductor device according to a third embodiment of the present disclosure. A semiconductor device 100b according to the present embodiment includes test electrode pads (test pads) 125 and 126 in addition to the configuration of the semiconductor device 100 described in the first embodiment shown in FIG. 1. The test pads 125 and 126 are electrically connected to the electrode pads 121 and 122, respectively. The test pad 125 is formed on the input-output block B 112, and the test pad 126 is formed on the input-output block A 111. Other configurations may be the same as the configuration of the semiconductor device 100 described in the first embodiment.

Generally, in semiconductor chip testing, a test needle may damage the electrode pads. For example, in the case where the electrode pads 121 and 122 are damaged, adhesion failure is likely to occur in the bonding of the bonding wires. To avoid this, in the present embodiment, the test pads 125 and 126 are used during test The test pads 125 and 126 are damaged by the test needle. However, since the electrode pads 121 and 122 are not damaged, it is possible to avoid such adhesion failure of the bonding wire.

In the following, the electrode pad 121 and the test pad 125 are assumed to be an electrode pad for signal input, and the electrode pad 122 and the test pad 126 are assumed to be an electrode pad for signal output. In the input-output block A 111, the electrode pad 121 and the test pad 125 are connected to the input buffer, and the electrode pad 122 and the test pad 126 are connected to the output buffer. In the input-output block B 112, the electrode pad 121 and the test pad 125 are connected to the input buffer, and the electrode pad 122 and the test pads126 are connected to the output buffer.

Figure 11:
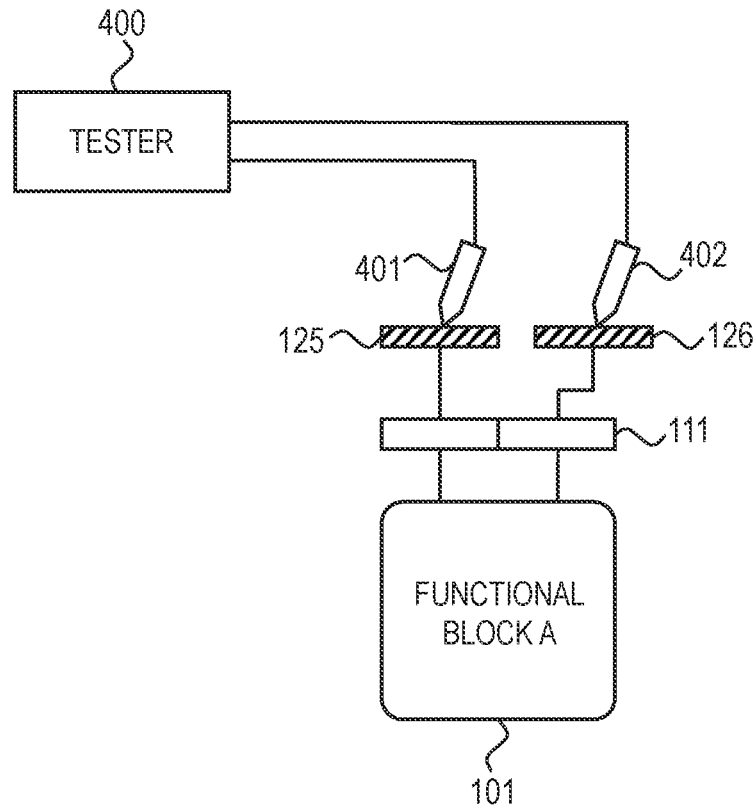
FIG. 11 is a block diagram schematically showing a test for a semiconductor device.

FIG. 11 schematically shows a test for the semiconductor device 100b. In the case of an alternate Current (AC) scan test, probe needles 401 and 402 are contacted with the test pad 125 for the input circuit and the test pad 126 for the output circuit, respectively, to perform the test. In FIG. 11, it is assumed that the functional block to be tested is a functional block A 101, A scan pattern (test signal) is input from the probe needle 401 to the test pad 125. The scan pattern is input to the functional block A 101 via the input-output block A 111. The logic circus t. of the functional block A 101 operates at the frequency of the product and outputs the operation result. The operation result (output signal) of the functional block A 101 is output from the test pad 126 via the input-output block A 111. A tester 400 acquires the operation result pattern) via the needle 402. The tester 400 determines whether or not the functional block A 101 is operating normally by determining whether or not the signal pattern (signal value) obtained from the test pad 126 and the expected value match.

If the resistor and the capacitance of the wiring are large in the signal path from the test pad 125 to the functional block A 101, a delay occurs in the input scan pattern. As a result, the expected value may not be stored in the flip-flops in the functional block A 101 operating at the frequency of the product. In this case, the result finally recognized by the tester is different from the expected value, and the yield is deteriorated.

Further, if the resistance and capacitance of the wiring are large in the signal path from the functional block A 101 to the test pad 126, a delay occurs in the signal output from the test pad 126. In this case, the result finally recognized by the tester is different from the expected value, and the yield is deteriorated. Incidentally, although the sampling period can be adjusted in the tester, adjustment at the sampling time is not easy because the manufacturing variation is different for each semiconductor chip.

In the present embodiment, as for the test pads 125 and 126, similarly to the electrode pads 121 and 122, the test pads 125 and. 126 can be connected to the input-output block A 111 and the input-output block B 112 by short-distance wirings. Further, the input-output block A 111 and the input-output block B 112 can be connected to the functional block A 101 and the functional block B 102 by short-distance wirings. Therefore, it is possible to optimize the resistance and capacitance of the wirings from the test pads 125 and 126 to the functional block A 101 and functional block 102, and it is possible to reduce the voltage drop and noise in the signal path for testing. As a result, it is possible to reduce the probability that the semiconductor device is determined to be defective in the test, and it is possible to suppress the deterioration of the yield.

Although the invention made by the present inventor has been specifically described based on the embodiments, the present invention is not limited to the embodiments described above, and it is needless to say that various modifications can be made without departing from the gist thereof.

What is claimed is:

1. A semiconductor device comprising:
   a plurality of electrode pads;
   a first input-output block coupled to each of the plurality of electrode pads;
   a second input-output block coupled to each of the plurality of electrode pads;
   a third input-output block coupled to each of the plurality of electrode pads;
   a first functional block coupled to each of the plurality of electrode pads via the first input-output block;
   a second functional block coupled to each of the plurality of electrode pads via the second input-output block; and
   a third functional block coupled to the each of the plurality of electrode pads via the third input-output block,
   wherein a first electrode pad of the plurality of electrode pads is located on the first input-output block and a second electrode pad of the plurality of electrode pads is located on the second input-output block,
   wherein each of the plurality of electrode pads is shared among the first, second, and third functional blocks via the first, second, and third input-output blocks, and
   wherein the first and second input-output blocks are located between the first functional block and the second functional block.

2. The semiconductor device according to claim 1, wherein the each of the plurality of electrode pads is formed at a position overlapping with one of the first and second input-output blocks.

3. The semiconductor device according to claim 1, wherein the first functional block, the second functional block, the first input-output block and the second input-output block are arranged in a region on a semiconductor chip that is located at a middle portion in a first direction and an end portion in a second direction orthogonal to the first direction.

4. The semiconductor device according to claim 1, wherein the first functional blocks, the second functional blocks, the first input-output block and the second input-output block are arranged in a corner portion of a semiconductor chip.

5. The semiconductor device according to claim 1, wherein the plurality of electrode pads includes a first electrode pad and a second electrode pad, wherein the first electrode pad is formed at a at a position overlapping with one of the first and second input-output blocks, and wherein the second electrode pad is formed at a at a position overlapping with the other of the first and second input-output blocks.

6. The semiconductor device according to claim 1, wherein the plurality of electrode pads is a part of a plurality of electrode pads that is formed on an entire surface of a semiconductor chip.

7. The semiconductor device according to claim 6, wherein the plurality of electrode pads that is formed on the entire surface of the semiconductor chip includes a dummy electrode pad that is not coupled to the first and second input-output blocks, and wherein the dummy electrode pad is formed at a position overlapping with the first or second functional blocks.

8. The semiconductor device according to claim 1, wherein the first, second and third input-output blocks are disposed between the first functional block and the second functional block.

9. The semiconductor device according to claim 1, further comprising a plurality of test electrode pads that is used during testing, and wherein each of the plurality of test electrode pads is coupled to the plurality of electrode pads.

10. The semiconductor device according to claim 9, wherein the plurality of electrode pads includes an electrode pad for signal input and an electrode pad for signal output, and wherein the plurality of test electrode pads includes a test electrode pad that is coupled to the electrode pad for the signal input and a test electrode pad that is coupled to the electrode pad for the signal output.

* * * * *